(12) United States Patent
Harrah

(10) Patent No.: US 7,631,986 B2
(45) Date of Patent: Dec. 15, 2009

(54) LIGHTING DEVICE PACKAGE

(75) Inventor: Shane Harrah, Everett, WA (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 219 days.

(21) Appl. No.: 11/980,991

(22) Filed: Oct. 31, 2007

(65) Prior Publication Data

US 2008/0180960 A1 Jul. 31, 2008

(51) Int. Cl.
*F21V 29/00* (2006.01)
*F21V 3/00* (2006.01)

(52) U.S. Cl. .......... 362/230; 362/249.01; 362/363; 257/98

(58) Field of Classification Search .......... 362/230, 362/231, 363, 249.01–249.06, 555, 311.02, 362/294, 800; 257/79, 98, 99, 100, 103
See application file for complete search history.

(56) References Cited

U.S. PATENT DOCUMENTS

| | | | |
|---|---|---|---|
| 5,077,587 | A | 12/1991 | Albergo et al. |
| 5,355,942 | A | 10/1994 | Conte |
| 5,813,753 | A | 9/1998 | Vriens et al. |
| 5,890,794 | A | 4/1999 | Abtahi et al. |
| 6,204,523 | B1 | 3/2001 | Carey et al. |
| 6,211,626 | B1 | 4/2001 | Lys et al. |
| 6,345,903 | B1 | 2/2002 | Koike et al. |
| 6,480,389 | B1 | 11/2002 | Shie et al. |
| 6,483,705 | B2 | 11/2002 | Snyder et al. |
| 6,498,355 | B1 | 12/2002 | Harrah et al. |
| 6,507,159 | B2 | 1/2003 | Muthu |
| 6,510,995 | B2 | 1/2003 | Muthu et al. |
| 6,590,235 | B2 | 7/2003 | Carey et al. |
| 6,610,563 | B1 | 8/2003 | Waitl et al. |
| 6,610,598 | B2 | 8/2003 | Chen |
| 6,617,795 | B2 | 9/2003 | Bruning |
| 6,630,801 | B2 | 10/2003 | Schuurmans |
| 6,639,360 | B2 | 10/2003 | Roberts et al. |

(Continued)

FOREIGN PATENT DOCUMENTS

EP 0 529 837 A1 3/1993

(Continued)

OTHER PUBLICATIONS

Kim et al., *Light Extraction in GaInN Light-Emitting Diodes using Diffuse Omnidirectional Reflectors*, Journal of the Electrochemical Society, 153(2):G105-G107 (2006).

*Primary Examiner*—Bao Q Truong

(57) ABSTRACT

The present invention provides a lighting device package that is configured to enable degassing of the lighting device package. The lighting device package comprises a substrate upon which is operatively mounted one or more light-emitting elements and a retaining structure which is coupled to the substrate and configured to circumscribe the one or more light-emitting elements. In addition, the lighting device package includes an optically transmissive element, wherein two or more supports are configured to provide a separation between the optically transmissive element and the substrate or retaining structure. The volume defined by the substrate, retaining structure and the optically transmissive element, is partially or completely filled with an encapsulation material, thereby forming the lighting device package. In particular, the supports create a series of openings for the volume defined by the substrate, retaining structure and the optically transmissive element, wherein these openings provide for movement of fluid therethrough.

25 Claims, 4 Drawing Sheets

U.S. PATENT DOCUMENTS

| | | |
|---|---|---|
| 6,659,578 B2 | 12/2003 | Gudaitis et al. |
| 6,679,315 B2 | 1/2004 | Cosley et al. |
| 6,707,069 B2 | 3/2004 | Song et al. |
| 6,717,362 B1 | 4/2004 | Lee et al. |
| 6,741,351 B2 | 5/2004 | Marshall et al. |
| 6,858,870 B2 | 2/2005 | Lee |
| 6,860,621 B2 | 3/2005 | Bachl et al. |
| 6,867,929 B2 | 3/2005 | Lopez-Hernandez et al. |
| 6,897,486 B2 | 5/2005 | Loh |
| 6,903,380 B2 | 6/2005 | Barnett et al. |
| 6,921,929 B2 | 7/2005 | LeBoeuf et al. |
| 6,924,514 B2 | 8/2005 | Suenaga |
| 6,933,535 B2 | 8/2005 | Steigerwald et al. |
| 6,940,704 B2 | 9/2005 | Stalions |
| 6,946,714 B2 | 9/2005 | Waitl et al. |
| 6,949,771 B2 | 9/2005 | Yoganandan et al. |
| 6,976,769 B2 | 12/2005 | McCullough et al. |
| 6,982,522 B2 | 1/2006 | Omoto |
| 6,991,356 B2 | 1/2006 | Tsimerman et al. |
| 6,995,402 B2 | 2/2006 | Ludowise et al. |
| 7,015,516 B2 | 3/2006 | Eliashevich et al. |
| 7,023,022 B2 | 4/2006 | Eliashevich et al. |
| 7,026,657 B2 | 4/2006 | Bogner et al. |
| 7,045,905 B2 | 5/2006 | Nakashima |
| 7,105,858 B2 | 9/2006 | Popovich |
| 2003/0030808 A1 | 2/2003 | Marshall et al. |
| 2003/0201451 A1 | 10/2003 | Suehiro et al. |
| 2004/0041222 A1 | 3/2004 | Loh |
| 2004/0079957 A1 | 4/2004 | Andrews et al. |
| 2004/0131096 A1 | 7/2004 | Lee |
| 2004/0169451 A1 | 9/2004 | Oishi et al. |
| 2004/0169466 A1 | 9/2004 | Suehiro et al. |
| 2004/0201987 A1* | 10/2004 | Omata ........................ 362/230 |
| 2004/0222433 A1 | 11/2004 | Mazzochette et al. |
| 2004/0251469 A1* | 12/2004 | Yatsuda et al. ................ 257/98 |
| 2005/0012108 A1 | 1/2005 | Lin et al. |
| 2005/0045904 A1 | 3/2005 | Chen |
| 2005/0139846 A1 | 6/2005 | Park et al. |
| 2005/0199884 A1 | 9/2005 | Lee et al. |
| 2005/0221519 A1 | 10/2005 | Leung et al. |
| 2005/0231983 A1 | 10/2005 | Dahm |
| 2005/0269587 A1 | 12/2005 | Loh et al. |
| 2006/0017127 A1 | 1/2006 | Vigier-Blanc |
| 2006/0022214 A1 | 2/2006 | Morgan et al. |
| 2006/0083000 A1 | 4/2006 | Yoon et al. |
| 2006/0105485 A1 | 5/2006 | Basin et al. |
| 2006/0261470 A1 | 11/2006 | Schick |
| 2008/0054288 A1 | 3/2008 | Harrah et al. |

FOREIGN PATENT DOCUMENTS

| | | |
|---|---|---|
| EP | 1 367 640 A2 | 12/2003 |
| EP | 1 416 219 A1 | 5/2004 |
| EP | 1 453 107 A1 | 9/2004 |
| GB | 2 343 548 A | 5/2000 |
| JP | 11214741 A | 8/1999 |
| WO | WO 91/03085 | 3/1991 |
| WO | WO 02/081996 A2 | 10/2002 |
| WO | WO 03/010830 A2 | 2/2003 |
| WO | WO 2004/023522 A2 | 3/2004 |
| WO | WO 2004/100343 A2 | 11/2004 |
| WO | WO 2005/067063 A1 | 7/2005 |
| WO | WO 2005/107420 A2 | 11/2005 |
| WO | WO 2006/021837 A1 | 3/2006 |
| WO | WO 2006/065558 A2 | 6/2006 |
| WO | WO 2006/099741 A1 | 9/2006 |
| WO | WO 2008/003176 A1 | 1/2008 |

* cited by examiner

LIGHTING DEVICE PACKAGE

FIELD OF THE INVENTION

The present invention pertains to lighting and in particular to the design of lighting device packages.

BACKGROUND

Light-emitting diodes (LEDs) can be more effective if the LED package is adequately designed to effectively extract the light which is generated inside the LED under operating conditions. From the perspective of a device designer, effective light extraction can be a matter of improving the chances that light from the LED die is effectively guided so it can leave the LED package in the desired direction. A number of design features can influence the optical paths such as the orientation and the position of reflective interfaces and whether the type of reflection has a specular or diffuse nature. Moreover, refractive properties of elements of an LED package can affect the efficiency of the light extraction.

One of the problems associated with current LED packages occurs with those packages where there is a mounting edge or a seating shelf for a lens which covers an encapsulant-filled cavity. This configuration seals off the volume enclosing the encapsulant and can impair degassing. Thus bubbles of gas entrapped within the encapsulant can cause unwanted scattering of the light, causing deterioration of the light output of the package.

A further disadvantage of current LED packages is present in those packages where there is a mounting surface for the lens rather than a mounting edge. Due to the planar nature of the interface between the lens and the mounting surface, the encapsulant can easily be trapped within this interface, together with gas bubbles therein. This again can result in a deterioration of the light output of the package.

Therefore there is a need for a new lighting device package that overcomes some of the drawbacks of known designs.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a lighting device package. In accordance with an aspect of the present invention, there is provided a lighting device package comprising: a substrate; one or more light-emitting elements operatively coupled to the substrate; a retaining structure coupled to the substrate and circumscribing the one or more light-emitting elements; an optically transmissive element coupled to the substrate and positioned to intersect a path of electromagnetic radiation emitted by the one or more light-emitting elements; a light transmissive encapsulation material positioned within a volume defined by the substrate, the optically transmissive element and the retaining structure, the encapsulation material thereby at least partially encapsulating the one or more light-emitting elements therein; and two or more supports extending at least partially between the optically transmissive element and the substrate, the two or more supports configured to support the optically transmissive element; wherein the two or more supports are disposed to provide two or more openings for the volume for movement of fluid therethrough.

In accordance with another aspect of the present invention, there is provided a lighting device package comprising: a substrate; one or more light-emitting elements operatively coupled to the substrate; a retaining structure coupled to the substrate and circumscribing the one or more light-emitting elements; an optically transmissive element coupled to the substrate and positioned to intersect a path of electromagnetic radiation emitted by the one or more light-emitting elements; a light transmissive encapsulation material positioned within a volume defined by the substrate, the optically transmissive element and the retaining structure, the encapsulation material thereby at least partially encapsulating the one or more light-emitting elements therein; and two or more supports extending at least partially between the optically transmissive element and the substrate for supporting the optically transmissive element, each of the two or more supports having a cross section and a contact surface, wherein the cross section is smaller at the contact surface; wherein the two or more supports are disposed to provide two or more openings for the volume for movement of fluid therethrough.

DETAILED DESCRIPTION OF THE INVENTION

Definitions

Figure 1:
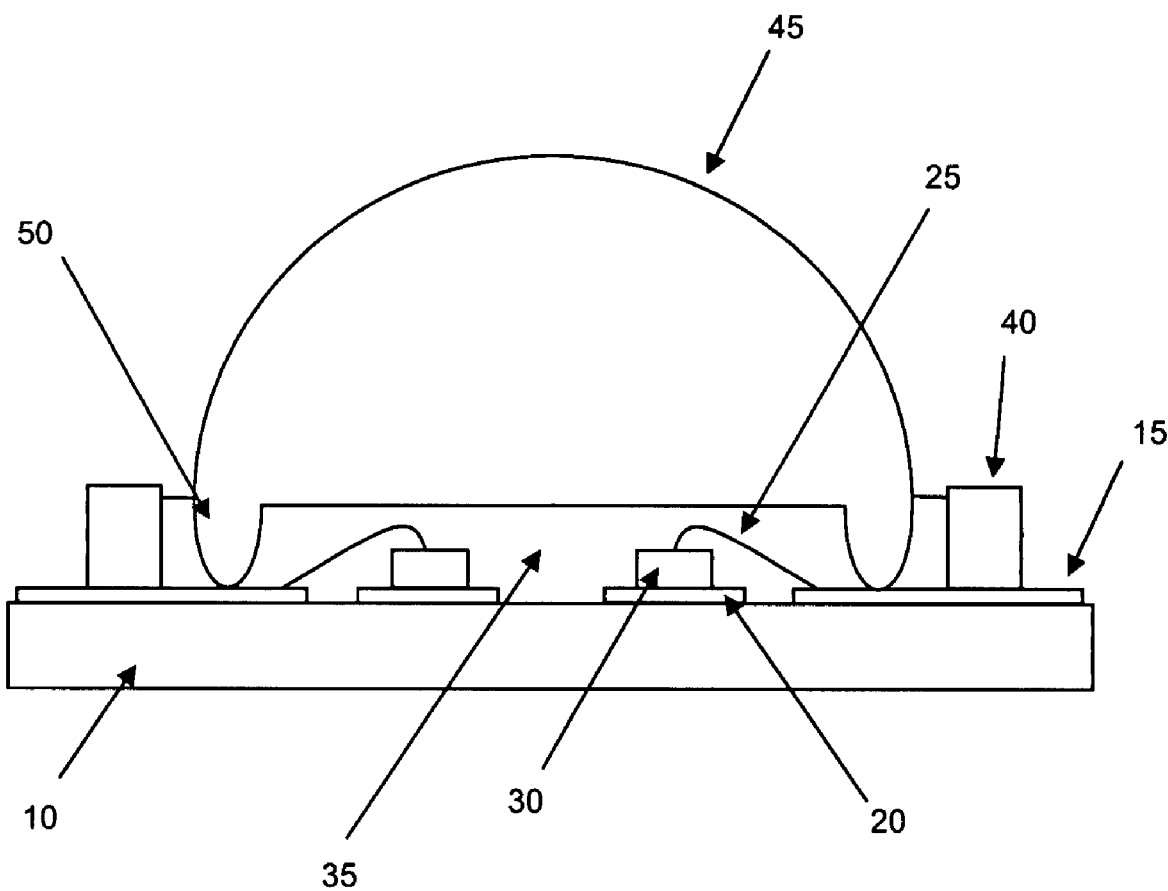
FIG. 1 schematically illustrates a cross section of a lighting device package according to one embodiment of the present invention.

The term "light-emitting element" is used to refer to a device that comprises an element which emits radiation in a wavelength region or combination of wavelength regions of the electromagnetic spectrum, for example, the visible region, infrared or ultraviolet region, when activated by applying a potential difference across it or passing an electrical current through it. For example, a light-emitting element can have monochromatic, quasi-monochromatic, polychromatic or broadband spectral emission characteristics. Examples of light-emitting elements include inorganic or organic solid-state, organic or polymer/polymeric light-emitting diodes, optically pumped phosphor coated light-emitting diodes, optically pumped nanocrystal light-emitting diodes or other similar devices as would be readily understood by a worker skilled in the art.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood in the art to which this invention belongs.

The present invention provides a lighting device package that is configured to enable degassing of the lighting device package. The lighting device package comprises a substrate upon which is operatively mounted one or more light-emitting elements and a retaining structure which is coupled to the substrate and configured to circumscribe the one or more light-emitting elements. In addition, the lighting device package includes an optically transmissive element, for example a lens, positioned over the one or more light-emitting elements, wherein two or more supports are configured to provide a separation between the optically transmissive element and the substrate or retaining structure. The volume defined by the substrate, retaining structure and the optically transmissive element, is partially or completely filled with an encapsulation material, thereby forming the lighting device package. In particular, the supports create a series of openings for the volume defined by the substrate, retaining structure and the optically transmissive element, wherein these openings provide for movement of fluid therethrough. The fluid can be gas, for example gas trapped within the volume, light transmissive encapsulation material, water, or the like as would be readily understood by a worker skilled in the art. Hence these openings provide locations for the degassing of the lighting device package, for example these openings can provide locations for the venting of gas from the volume.

In one embodiment the two or more supports are associated with the optically transmissive element. In one embodiment the two or more supports are integrally formed with the optically transmissive element and couple it to the substrate or the retaining structure. In other embodiments, the supports are associated with the substrate or retaining structure, rather than the optically transmissive element. In some embodiments, the supports can be integrally formed with the substrate or retaining structure.

FIG. 1 illustrates a cross sectional view of a lighting device package according to one embodiment of the present invention. Light-emitting elements 30 are mounted and electrically connected to metallization pads 20 of the substrate 10 and the light-emitting elements 30 are further electrically connected by wire bonds 25 to circuit traces 15 of the substrate thereby enabling the activation of the light-emitting elements. Coupled to the substrate 10 is a retaining structure in the form of a retaining wall 40 which circumscribes the light-emitting elements operatively coupled to the substrate. An optically transmissive element in the form of a lens 45 is coupled to the substrate by supports in the form of support feet 50, of the lens. Two or more support feet 50 are associated with the lens, wherein the support feet create a series of openings between the lens and the substrate. The lighting device package further comprises an encapsulation material 35 which fills the volume defined by the substrate, lens and retaining wall, thereby encapsulating the light-emitting elements therein. The openings for this volume, which are created by the support feet, provide locations for the degassing of the lighting device package, for example locations for the venting of gas bubbles which may be present in the encapsulation material or within the volume.

Optically Transmissive Element

The optically transmissive element essentially provides a cover for the one or more light-emitting elements operatively coupled to the substrate, and together with the substrate and the retaining structure defines a volume which substantially encloses the one or more light-emitting elements, wherein this volume is partially or completely filled with an encapsulation material.

In one embodiment the optically transmissive element includes two or more supports, which provide mechanical support for the positioning of the optically transmissive element relative to the one or more light-emitting elements, for example for the mounting of the optically transmissive element on the substrate or on the retaining structure. The two or more supports create a series of openings for the volume defined by the substrate, the retaining structure and the optically transmissive element, wherein these openings provide locations for the venting of gases which may otherwise be trapped within the defined volume during fabrication of the lighting device package.

The optically transmissive element can provide for the manipulation and extraction of electromagnetic radiation from the lighting device package, which is generated by the one or more light-emitting elements. In one embodiment of the present invention, the optically transmissive element is configured as a lens, for example a dome lens or other lens as would be readily understood by a worker skilled in the art.

In some embodiments of the present invention, the two or more supports may be an integral portion of the retaining structure or the substrate rather than the optically transmissive element. For example, the retaining structure may have two or more support feet disposed towards the optically transmissive element, and a portion of the optically transmissive element may be seated on these support feet.

The two or more supports can be configured in a variety of shapes, for example support feet, support walls, support tabs or other configurations as would be readily understood by a worker skilled in the art. The supports can be located on a surface of the optically transmissive element which is facing the substrate, positioned on the side of the optically transmissive element, or positioned on a surface of the substrate or retaining structure.

Each support has a contact surface which contacts the substrate or the retaining structure in embodiments where the supports are part of the optically transmissive element, or contacts the optically transmissive element in embodiments where the supports are part of the substrate or retaining structure. This contact surface can be conical, hemispherical, cylindrical, frustoconical, a flat surface, a curved surface, a convex surface or other surface shape as would be readily understood by a worker skilled in the art.

In one embodiment of the present invention, the contact surface of a support is configured to minimize the area of contact between a support and either the substrate or the retaining structure in embodiments where a support is part of the optically transmissive element, or between a support and the optically transmissive element in embodiments where a support is part of the substrate or the retaining structure. For example, the cross section of a support decreases toward the contact surface. In some embodiments the contact surface is configured to be conical or hemispherical thereby resulting in substantially a point of contact or in another embodiment a cylindrical surface which can result in substantially a line point of contact. Line points of contact, in some embodiments, can be in a substantially radial direction from the central area of the bottom surface of the optically transmissive element. In these configurations, the reduction in the area of contact can enable the reduction of the potential of the trapping of encapsulation material by the contact surface of the support feet.

In one embodiment the optically transmissive element includes two or more supports, which can enable the stable support of the optically transmissive element on the substrate or the retaining structure, wherein the number of supports can be dependent on the shape thereof. For example, if the supports are each configured to have a point of contact with the substrate or the retaining wall, in order to provide stable support of the optically transmissive element thereon three or more supports may be required. In other embodiments of the present invention, the optically transmissive element comprises three, four, five, six or other number of supports, provided that the relative size and number of supports associated with the optically transmissive element are determined such that a desired series of openings in the volume defined by the substrate, the retaining structure and the optically transmissive element, are capable of enabling a desired level of degassing of the lighting device package.

In one embodiment of the present invention, the supports are configured to have a degree of flexibility, extensibility, compressibility, or a combination thereof. In this configuration the supports can be capable of enabling movement of the optically transmissive element relative to the substrate which can reduce stress retention within the lighting device package, which may result in component separation or partial delamination of the encapsulation material. These potential stresses may be induced by differential thermal expansion coefficients of the materials which form the lighting device package, for example.

In embodiments where the optically transmissive element is mounted on the substrate or retaining structure, the mounting can be accomplished by using encapsulation material, silicone, epoxy, or the like as would be known to a worker skilled in the art.

In some embodiments of the present invention, the optically transmissive element and the two or more supports are integrally formed. In another embodiment the optically transmissive element and the two or more supports can be formed separately and subsequently mechanically connected. For example, the supports can be formed separately and subsequently mechanically coupled to the optically transmissive element. In embodiments where the supports are part of the retaining structure or the substrate, the supports can be integrally formed, or formed separately and subsequently mechanically connected. For example, the supports can be formed separately and subsequently mechanically coupled to the either the retaining structure or the substrate.

The surface of the optically transmissive element which faces the one or more light-emitting elements can be curved or flat. In one embodiment, the surface is convex in shape thereby reducing the likelihood of gas being trapped between this surface of the optically transmissive element and the encapsulation material.

In one embodiment of the present invention, the optically transmissive element comprises a combination of optical elements, wherein these optical elements may vary in size. For example sub-micrometer to millimeter or larger sized lenticular or other refractive optical elements can be included in the optically transmissive element.

The optically transmissive element can be made of moulded plastic, clear PMMA, COC, BK7 glass, polycarbonate, nylon, silicone, silicone rubber or other material as would be readily understood by a worker skilled in the art. The optically transmissive element can optionally be configured as a coloured component while retaining the required level of optical transmissivity for the lighting device package.

Encapsulation Material

The encapsulation material partially or completely fills a volume or cavity defined by the substrate, retaining structure and the optically transmissive element, and thereby at least partially encapsulates the one or more light-emitting elements. The encapsulation material can provide for an increased level of light extraction from the one or more light-emitting elements.

In one embodiment of the present invention, the optical transmissivity of the encapsulation material can vary with wavelength. For example, the variation of the transmissivity with respect to wavelength can be significant or it can be negligible for the desired purpose of the encapsulation material. For example, the refractive indices of the encapsulation material and the optically transmissive element can be chosen so that light can be efficiently extracted from the one or more light-emitting elements to the ambient. In one embodiment, the encapsulation material and the optically transmissive element can be configured to have about the same refractive index. In another embodiment, the refractive index of the encapsulation material is greater than the refractive index of the optically transmissive element.

In one embodiment, the encapsulation material can be selected from optically clear materials such as silicone gels, for example. Other encapsulation materials with suitable refractive indices include PMMA, polycarbonate, nylon, silicone rubber and silicone gel, for example, which typically absorb little visible light and typically only certain ultra violet (UV) light. Some of these types of materials can provide some resistance to discoloration under prolonged exposure to UV light and they are available in a range of suitable indices of refraction.

The encapsulation material can be deposited in many different ways during the assembly of the substrate, retaining structure, and optically transmissive element to realize a lighting device package which has a volume or cavity that is filled with a desired amount of encapsulation material. For example, one or more light-emitting elements can be deposited on the substrate, then the retaining structure, which laterally encloses the outer perimeter of the one or more light-emitting elements, can be deposited on the substrate. A predetermined amount of encapsulation material in a desired modification, for example, in a liquid state, can be deposited on or adjacent to the one or more light-emitting elements, and subsequently an optically transmissive element can be deposited on the substrate or the retaining structure. For example, upon complete assembly of the lighting device package, the encapsulation material can completely encapsulate otherwise exposed portions of the one or more light-emitting elements and the volume or cavity defined by the substrate, retaining structure and the optically transmissive element can be completely filled. In some embodiments, the encapsulation material can subsequently be cured.

In one embodiment of the present invention, to accelerate the venting of gas bubbles within a liquid encapsulation material, the lighting device package may be exposed temporarily to a reduced pressure atmosphere as a degassing process. Following this degassing process, the liquid encapsulation material may be cured, for example through exposure to heat or UV light, if necessary to achieve desired material properties.

Retaining Structure

A retaining structure is coupled to the substrate and configured to circumscribe one or more light-emitting elements which are operatively coupled to the substrate. The retaining structure provides a boundary or perimeter which can provide a means for retaining the encapsulation material in the desired region.

In one embodiment of the present invention, the retaining structure forms a retaining wall around the one or more light-emitting elements, and is configured to solely provide a structure to retain the encapsulation material within the cavity defined by the wall.

In another embodiment of the present invention, the retaining structure forms a retaining wall around the one or more light-emitting elements and is configured to provide both a structure to retain the encapsulation material within the cavity defined by the wall and further provides a support structure for the mounting of optically transmissive element.

In one embodiment of the present invention, the inner wall of the retaining structure is configured as a vertical wall, or a profiled wall, for example a sloped or curved wall, wherein the optically transmissive element can be supported on the substrate, or supported on the top of the retaining structure.

In another embodiment of the present invention, the inner wall of the retaining structure is configured as a stepped wall, wherein the step can provide a support surface for the optically transmissive element.

In another embodiment, the supports can be integrally formed with the retaining structure. For example, a moulding process could be employed to fabricate a retaining structure with integral supports for coupling to the optically transmissive element.

In one embodiment, the retaining structure can be a separate component or it can be integrally formed with one or more elements of an optical system, for example the optically transmissive element wherein supports define openings for the enclosed volume. For example, a dual shot moulding process can be employed to fabricate an integrally formed or integrally connected retaining structure and lens.

In another embodiment of the present invention, the retaining structure can be directly and operatively disposed on the substrate by moulding it onto the substrate using the substrate as a part of the mould during the moulding process, for example as is done with insert moulding. In another embodiment of the present invention the retaining structure is integrally formed with the substrate.

The retaining structure can be fabricated from a variety of materials for example, ceramic, polymer, polyimide, glass, moulded plastic, moulded silicone, metal, dispensed epoxy or silicone bead which is cured prior to dispensing or insertion of the encapsulation material, or other material as would be readily understood by a worker skilled in the art. The coupling of the retaining structure to the substrate can be provided by an adhesive, heat staking, integral forming, or other method as would be readily understood by a worker skilled in the art.

The retaining structure can be configured to be reflective, opaque, translucent, transparent or non-reflective, wherein the configuration of the retaining structure can be determined based on the desired affect which the retaining structure has on the electromagnetic radiation emitted by the one or more light-emitting elements.

In one embodiment of the present invention, the inside surface of the retaining structure is predominantly intended to reflect light which is laterally emitted from the light-emitting elements. An adequately designed and highly reflective inside surface can contribute to efficient light extraction from the lighting device package.

In one embodiment, the inside surface of the retaining structure facing the one or more light-emitting elements and can be diffuse or specular reflective. For example, the inside surface can be white and characterised by mixed diffuse and specular reflective characteristics. White surfaces can be realized in various different ways, for example, the surface can be coated or painted. A portion of the surface of the retaining structure or the whole retaining structure can be made of a white material, for example a white ceramic or white plastic, for example Amodel™ plastic or other material as would be readily understood. Alternatively, the inside surface of the retaining structure can be metallized, for example, to realize a mirror with a desired mix of specular or diffuse reflective characteristics.

In one embodiment, the inside surface or another surface of the retaining structure can comprise a layer of specular reflective aluminium or silver, for example. Metallic layers can be deposited using various methods including sputtering, ablation or evaporation, for example.

In one embodiment, the retaining structure can be injection moulded and coated with a layer of metal on the inside surface, for example. Alternatively, the material for the retaining structure or the inside surface of the retaining structure can have an index of refraction lower than that of the encapsulation material. If the inside surface is appropriately shaped and the refractive indices are properly chosen, light from within the encapsulation material can be effectively totally internally reflected (TIR) at the inside surface towards an optical system.

Substrate

In one embodiment, the substrate is highly thermally conductive. The substrate can comprise one or more layers of AlN ceramic with metallization on the top and bottom, for example. The substrate can be a low temperature co-fired ceramic on Cu/Mo/Cu metal base, for example. In one embodiment, the substrate can also comprise a moulded plastic material such as liquid crystal polymer plastic or Amodel™ plastic, for example. The substrate may also be configured as a metal base PC board.

In one embodiment, the surface of the substrate facing the region of light-emitting element attachment, or certain areas of it, can be diffuse or specular reflective. The reflective properties can result from metal, for example, aluminium or silver coatings.

In one embodiment, the substrate can provide one or more layers with traces or vias for connecting the light-emitting elements, die attach pads or other electrical devices. The layers or traces can comprise various materials such as metal alloys including a combination of copper, silver, gold, aluminium, nickel, or tin, for example.

In one embodiment of the present invention, the substrate can be configured as a multilayer structure, which comprises electrically conductive and electrically insulative layers. One or more substrate layers comprising electrically conductive components, for example light-emitting elements, that must not be short-circuited such as certain combinations of electrically conductive traces, for example, may need to be electrically insulated from layers that are optically reflective but also electrically conductive. Suitable insulating materials are well known in the art. For example, metal traces on the substrate's top surface can be buried under a thin electrically insulating layer of dielectric material, for example 0.5 to 2 mil thick polyimide. In one embodiment, the insulating layer can be unselectively or selectively deposited also including areas covered by the retaining structure, which may be electrically conductive. In another embodiment, an insulating layer can be deposited to realize a smoother more even interface between the substrate and the retaining structure, for example.

In one embodiment, the substrate can be soldered to a PC board, a flex circuit or to wires connected to electrical drive circuitry. The substrate can have one or more electrically conductive layers comprising Au or Au/Sn or another solder alloy.

In one embodiment, the lighting device package can be thermally connected to a heat sink or heat pipe. The thermal coupling can be provided by solder, thermally conductive epoxy or other thermal connection means as would be readily understood by a worker skilled in the art.

Light-Emitting Element Attachment

In one embodiment of the present invention, light-emitting elements, for example LED dice, can be attached, for example soldered, to die attach pads on the substrate. The die attach pads can have die attach pad contacts with solder alloys, comprising gold, for example a gold tin or gold silver alloy. The light-emitting elements can have die contacts comprising, for example, gold, gold-tin or other alloys. Depending on the composition of the contacts of the light-emitting elements and the composition of the die attach pads, solder alloys can be reflowed (liquefied) at elevated temperatures to attach the light-emitting elements to the die attach pads. Alternatively a solder paste can be deposited on the die attach pads before disposing the light-emitting elements. Solder paste can comprise, for example Au/Sn, which can be reflowed at elevated temperature to create a bond.

In one embodiment, an electrically and thermally conductive adhesive can be used to attach the light-emitting elements to the die attach pads. Such adhesives can include Ag containing epoxy, for example. Depending on the kind of adhesive, solder alloy metal die attach pads may not be required to establish a durable mechanical and electrical contact. The die attach pads on the substrate can provide a highly optically reflective top surface and can be thermally well connected to a common underlying metallization layer. Such metallization layers are widely used in certain ceramic substrates. If required, different contacts of the light-emitting elements can be separately connected to their own contact pad or trace which can be located on either a die attach pad or elsewhere on the substrate. Individual contacts on a die attach pad can be operatively connected to traces on the substrate.

Other suitable methods for the attachment of the one or more light-emitting elements would be readily understood by a worker skilled in the art.

EXAMPLES

Example 1

FIG. 1 illustrates a cross sectional view of a lighting device package according to one embodiment of the present invention. Light-emitting elements 30 are mounted and electrically connected to metallization pads 20 of the substrate 10 and the light-emitting elements 30 are further electrically connected by wire bonds 25 to circuit traces 15 of the substrate thereby enabling the activation of the light-emitting elements. Coupled to the substrate 10 is a retaining structure in the form of a retaining wall 40 which circumscribes the light-emitting elements operatively coupled to the substrate. An optically transmissive element in the form of a lens 45 has supports in the form of support feet 50 which couple the lens to the substrate. In this embodiment based on the configuration of the support feet, three or more support feet 50 are associated with the lens in order to stably support the lens, wherein the support feet create a series of openings between the lens and the substrate. The lighting device package further comprises an encapsulation material 35 which fills the volume defined by the substrate, lens and retaining wall, thereby encapsulating the light-emitting elements therein. The openings for this volume, which are created by the support feet, provide locations for the degassing of the lighting device package, for example locations for the venting of gas bubbles which may form in a liquid encapsulation material.

In one embodiment of the present invention, to accelerate the venting of these gas bubbles, the lighting device package may be exposed temporarily to a reduced pressure atmosphere as a degassing process. Following this degassing process, the liquid encapsulation material may be cured, for example through exposure to heat or UV light, if necessary to achieve desired material properties.

Example 2

Figure 2:
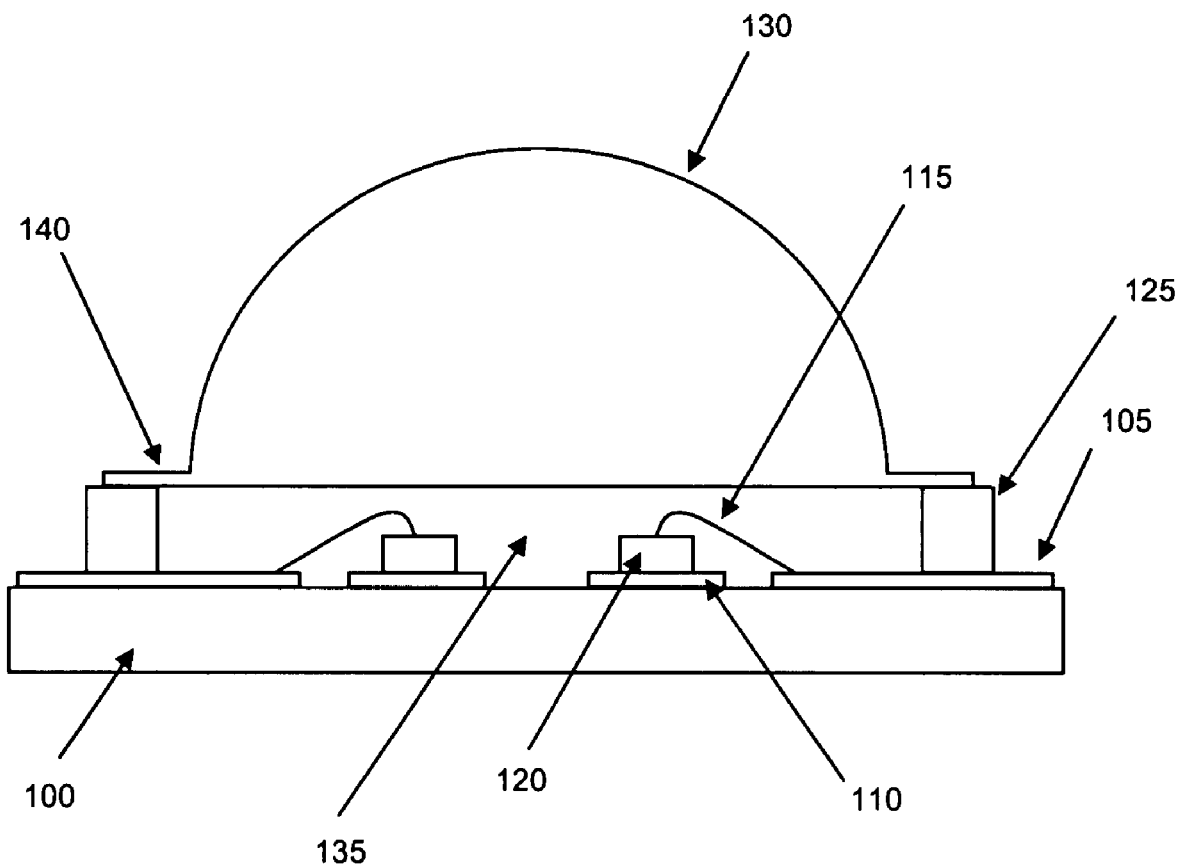
FIG. 2 schematically illustrates a cross section of components of a lighting device package according to another embodiment of the present invention.
Figure 3:
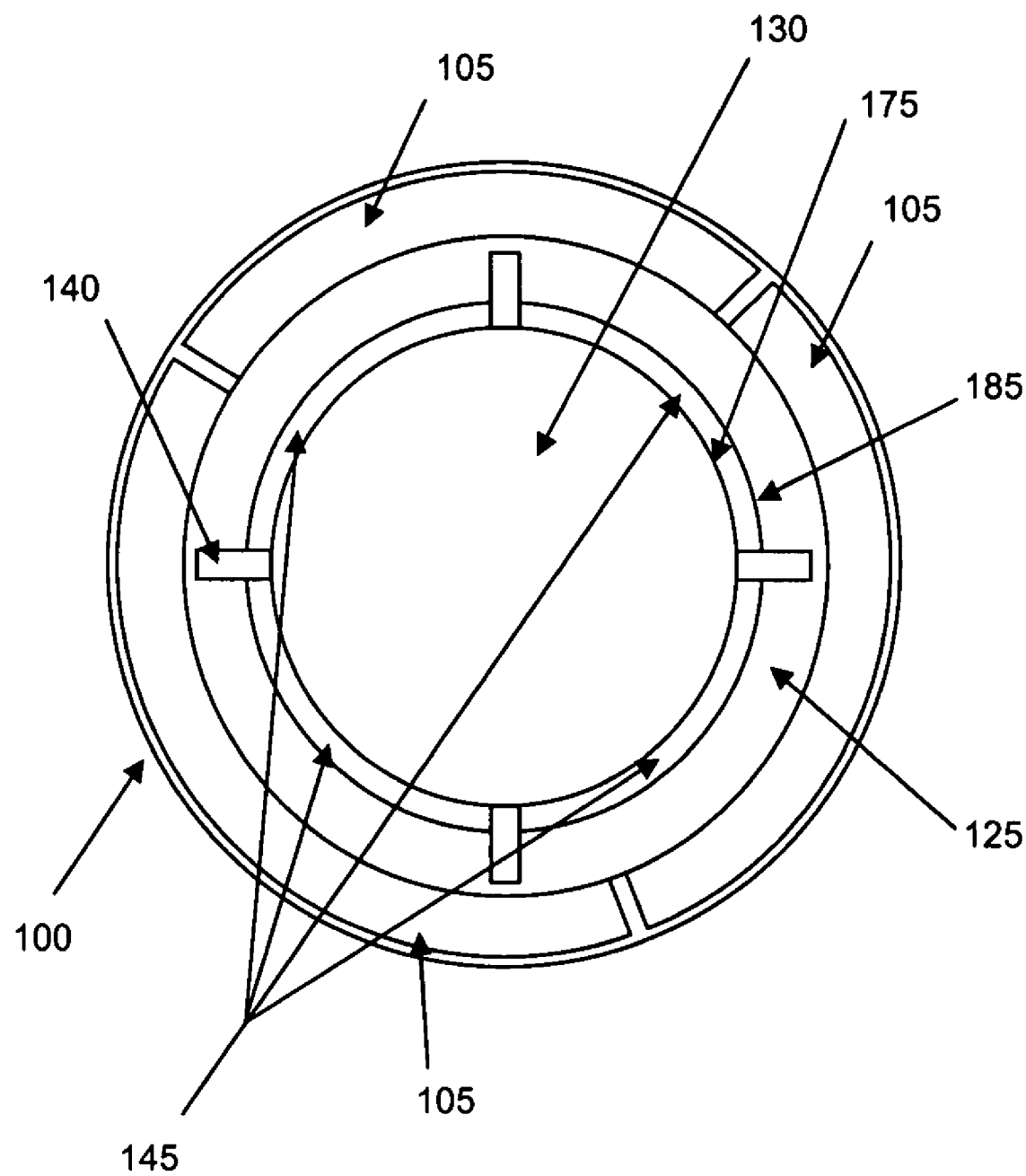
FIG. 3 schematically illustrates a top view of a lighting device package illustrated in FIG. 2.

FIG. 2 illustrates a cross sectional view of lighting device package according to another embodiment of the present invention, and FIG. 3 illustrates a top view thereof. Light-emitting elements 120 are mounted and electrically connected to metallization pads 110 of the substrate 100 and the light-emitting elements 120 are further electrically connected by wire bonds 115 to circuit traces 105 of the substrate thereby enabling the activation of the light-emitting elements. Coupled to the substrate 100 is a retaining structure in the form of a retaining wall 125 which circumscribes the light-emitting elements operatively coupled to the substrate. An optically transmissive element in the form of a lens 130 is mounted to the top of the retaining wall by supports in the form of support tabs 140. Two or more support tabs 140 can be associated with the lens and can provide a desired stability thereof, wherein the support tabs create a series of openings 145 between the lens and the volume defined by the substrate, the retaining wall and the lens. For example, having regard to FIG. 2, the openings can be located infront of or behind the tab 140. In addition and with reference to FIG. 3, the openings 145 can located between the outer edge 175 of the lens 130 and the inner edge 185 of the retaining wall 125. As illustrated in FIG. 3, four support tabs are associated with the lens, thus resulting in four openings 145. The lighting device package further comprises an encapsulation material 135 which fills the volume defined by the substrate, lens and retaining wall, thereby encapsulating the light-emitting elements therein. The openings 145 within this volume, which are created by the support tabs, provide locations for the degassing of the lighting device package, for example locations for the venting of gas bubbles which may be present in the encapsulation material.

Example 3

Figure 4:
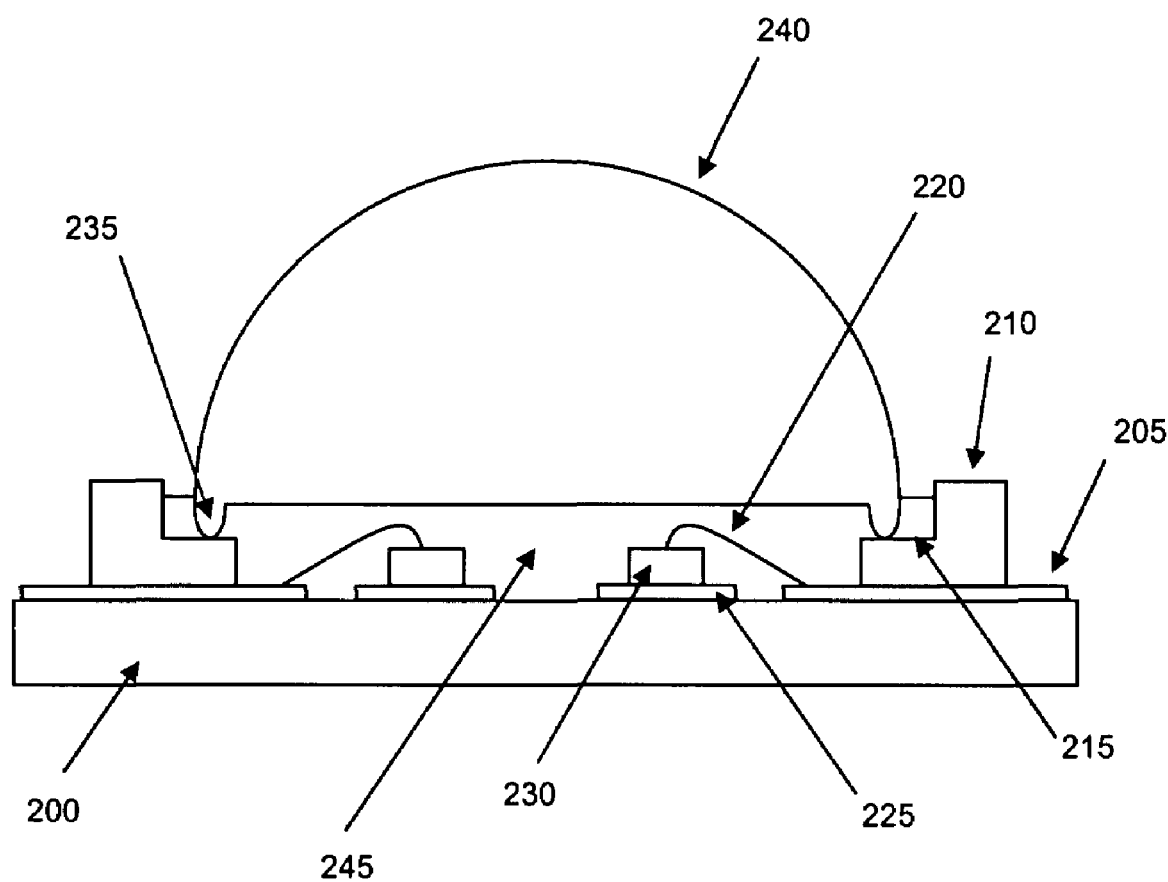
FIG. 4 schematically illustrates a cross section of components of a lighting device package according to another embodiment of the present invention.

FIG. 4 illustrates a cross sectional view of another lighting device package according to one embodiment of the present invention. Light-emitting elements 230 are mounted and electrically connected to metallization pads 225 of the substrate 200 and the light-emitting elements 230 are further electrically connected by wire bonds 220 to circuit traces 205 of the substrate thereby enabling the activation of the light-emitting elements. Coupled to the substrate 200 is a retaining structure in the form of a retaining wall 210 which circumscribes the light-emitting elements operatively coupled to the substrate. The retaining wall 210 is formed with a seating shelf 215. An optically transmissive element in the form of a lens 240 is coupled to the retaining wall and specifically the seating shelf by supports in the form of support feet 235. In one embodiment, two or more support feet 235 are associated with the lens in order to stably support the lens, wherein the support feet create a series of openings between the lens and the substrate. In another embodiment three or more support feet can be associated with the lens. The lighting device package further comprises an encapsulation material 245 which fills the volume defined by the substrate, lens and retaining wall, thereby encapsulating the light-emitting elements therein. The openings for this volume, which are created by the support feet, provide locations for the degassing of the lighting device package, for example locations for the venting of gas bubbles which may be present in the encapsulation material.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

I claim:

1. A lighting device package comprising:
   a substrate;
   one or more light-emitting elements operatively coupled to the substrate;
   a retaining structure coupled to the substrate and circumscribing the one or more light-emitting elements;
   an optically transmissive element coupled to the substrate and positioned to intersect a path of electromagnetic radiation emitted by the one or more light-emitting elements;
   a light transmissive encapsulation material positioned within a volume defined by the substrate, the optically transmissive element and the retaining structure, the encapsulation material thereby at least partially encapsulating the one or more light-emitting elements therein; and
   two or more supports extending at least partially between the optically transmissive element and the substrate, the two or more supports configured to support the optically transmissive element;
   wherein the two or more supports are disposed to provide two or more openings for the volume for movement of fluid therethrough.

2. The lighting device package of claim 1 wherein the two or more supports are flexible, compressible, extensible, or a combination thereof.

3. The lighting device package of claim 1 wherein each of the two or more supports has a cross section and a contact surface, wherein the cross section is smaller at the contact surface.

4. The lighting device package of claim 3 wherein the contact surface is substantially a point of contact.

5. The lighting device package of claim 3 wherein the contact surface is substantially a point line of contact.

6. The lighting device package of claim 1 wherein each support has a contact surface, the contact surface having a shape selected from the group comprising conical, hemispherical, cylindrical, frustroconical, flat, curved and convex.

7. The lighting device package of claim 1 wherein the retaining structure is integrally formed with the optically transmissive element.

8. The lighting device package of claim 1 wherein the retaining structure is operatively disposed on the substrate.

9. The lighting device package of claim 1 wherein the two or more supports are integrally formed with the optically transmissive element.

10. The lighting device package of claim 1 wherein the two or more supports are connected to the optically transmissive element.

11. The lighting device package of claim 9 wherein the supports contact one or more of the substrate and the retaining structure.

12. The lighting device package of claim 10 wherein the supports contact one or more of the substrate and the retaining structure.

13. The lighting device package of claim 1 wherein the retaining structure comprises an inner wall configured as a stepped wall to provide a support surface for the two or more supports.

14. The lighting device package of claim 1 wherein the two or more supports are integrally formed with the substrate.

15. The lighting device package of claim 1 wherein the two or more supports are connected to the substrate.

16. The lighting device package of claim 1 wherein the two or more supports are integrally formed with the retaining structure.

17. The lighting device package of claim 1 wherein the two or more supports are connected to the retaining structure.

18. The lighting device package of claim 1 wherein the optically transmissive element has a surface facing the light-emitting elements, wherein the surface is convex.

19. A lighting device package comprising:
    a substrate;
    one or more light-emitting elements operatively coupled to the substrate;
    a retaining structure coupled to the substrate and circumscribing the one or more light-emitting elements;
    an optically transmissive element coupled to the substrate and positioned to intersect a path of electromagnetic radiation emitted by the one or more light-emitting elements;
    a light transmissive encapsulation material positioned within a volume defined by the substrate, the optically transmissive element and the retaining structure, the encapsulation material thereby at least partially encapsulating the one or more light-emitting elements therein; and
    two or more supports extending at least partially between the optically transmissive element and the substrate for supporting the optically transmissive element, each of the two or more supports having a cross section and a contact surface, wherein the cross section is smaller at the contact surface;
    wherein the two or more supports are disposed to provide two or more openings for the volume for movement of fluid therethrough.

20. The lighting device package of claim 19 wherein the two or more supports are flexible, compressible, extensible, or a combination thereof.

21. The lighting device package of claim 19 wherein the contact surface is substantially a point of contact.

22. The lighting device package of claim 19 wherein the contact surface is substantially a point line of contact.

23. The lighting device package of claim 19 wherein the two or more supports are integrally formed with the retaining structure.

24. The lighting device package of claim 19 wherein the two or more supports are integrally formed with the substrate.

25. The lighting device package of claim 19 wherein the retaining structure is integrally formed with the optically transmissive element.

* * * * *